(12) United States Patent
Yuh et al.

(10) Patent No.: US 12,254,923 B2
(45) Date of Patent: *Mar. 18, 2025

(54) NONVOLATILE SRAM

(71) Applicant: Taiwan Semiconductor Manufacturing Company, Ltd., Hsinchu (TW)

(72) Inventors: Perng-Fei Yuh, Walnut Creek, CA (US); Jui-Che Tsai, Tainan (TW); Hiroki Noguchi, Hsinchu (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/149,149

(22) Filed: Jan. 2, 2023

(65) Prior Publication Data

US 2023/0147686 A1 May 11, 2023

Related U.S. Application Data

(63) Continuation of application No. 17/094,307, filed on Nov. 10, 2020, now Pat. No. 11,545,218.

(60) Provisional application No. 62/955,531, filed on Dec. 31, 2019.

(51) Int. Cl.
| | | |
|---|---|---|
| *G11C 16/04* | (2006.01) | |
| *G11C 11/16* | (2006.01) | |
| *G11C 11/412* | (2006.01) | |
| *G11C 11/418* | (2006.01) | |
| *G11C 11/419* | (2006.01) | |
| *G11C 14/00* | (2006.01) | |

(52) U.S. Cl.
CPC ...... *G11C 14/0081* (2013.01); *G11C 11/1655* (2013.01); *G11C 11/1657* (2013.01); *G11C 11/1673* (2013.01); *G11C 11/1675* (2013.01); *G11C 11/412* (2013.01); *G11C 11/418* (2013.01); *G11C 11/419* (2013.01)

(58) Field of Classification Search
CPC ...... G11C 16/20; G11C 16/0483; G11C 16/08
See application file for complete search history.

(56) References Cited

U.S. PATENT DOCUMENTS

| | | | |
|---|---|---|---|
| 9,437,298 B1 | 9/2016 | Tomishima et al. | |
| 9,564,209 B1 | 2/2017 | Lee et al. | |
| 9,734,909 B2* | 8/2017 | Chiou | G11C 13/0069 |
| 10,854,291 B2 | 12/2020 | Jaiswal et al. | |
| 11,545,218 B2* | 1/2023 | Yuh | G11C 11/1673 |
| 2008/0025070 A1 | 1/2008 | Horii et al. | |
| 2012/0020159 A1* | 1/2012 | Ong | G11C 14/0081 |
| | | | 365/185.08 |
| 2012/0320658 A1 | 12/2012 | Wang et al. | |

(Continued)

FOREIGN PATENT DOCUMENTS

TW  1605452 B  11/2017

*Primary Examiner* — Min Huang
(74) *Attorney, Agent, or Firm* — Merchant & Gould P.C.

(57) ABSTRACT

A memory device has a plurality of bit cells, each of which includes an SRAM cell having a storage node selectively connectable to a first bit line in response to a control signal received on a first word line. Each bit cell further includes an MRAM cell selectively connectable to the storage node of the SRAM cell in response to a control signal received on a second word line.

20 Claims, 12 Drawing Sheets

(56) References Cited

U.S. PATENT DOCUMENTS

| | | |
|---|---|---|
| 2013/0028012 A1 | 1/2013 | Fujita et al. |
| 2017/0221563 A1* | 8/2017 | Taniguchi .......... G11C 13/0069 |
| 2018/0174644 A1 | 6/2018 | Sakhare et al. |
| 2019/0279700 A1 | 9/2019 | Fujimori |

* cited by examiner

NONVOLATILE SRAM

CROSS REFERENCE TO RELATED APPLICATION

This application is a Continuation of U.S. application Ser. No. 17/094,307, filed Nov. 10, 2020, which claims the benefit of U.S. Provisional Application No. 62/955,531, filed Dec. 31, 2019, the disclosure of which is hereby incorporated herein by reference.

BACKGROUND

A common type of integrated circuit memory is a static random access memory (SRAM) device. A typical SRAM memory device has an array of memory cells. In some examples, each memory cell uses six transistors connected between an upper reference potential and a lower reference potential (typically ground) such that one of two storage nodes can be occupied by the information to be stored, with the complementary information stored at the other storage node. Each bit in the SRAM cell is stored on four of the transistors, which form two cross-coupled inverters. The other two transistors are connected to the memory cell word line to control access to the memory cell during read and write operations by selectively connecting the cell to its bit lines.

Due to its high speed operation, SRAM memory is often used for computing applications, such as implementing a cache memory. A central processing unit (CPU) cache is a hardware cache used by the CPU. CPUs access data from a main memory location, but this operation is time consuming and inefficient. A cache is used to provide faster access to frequently used data by storing that data locally. While SRAM maintains data in the memory array without the need to be refreshed when powered, it is volatile in that data is eventually lost when the memory is not powered

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
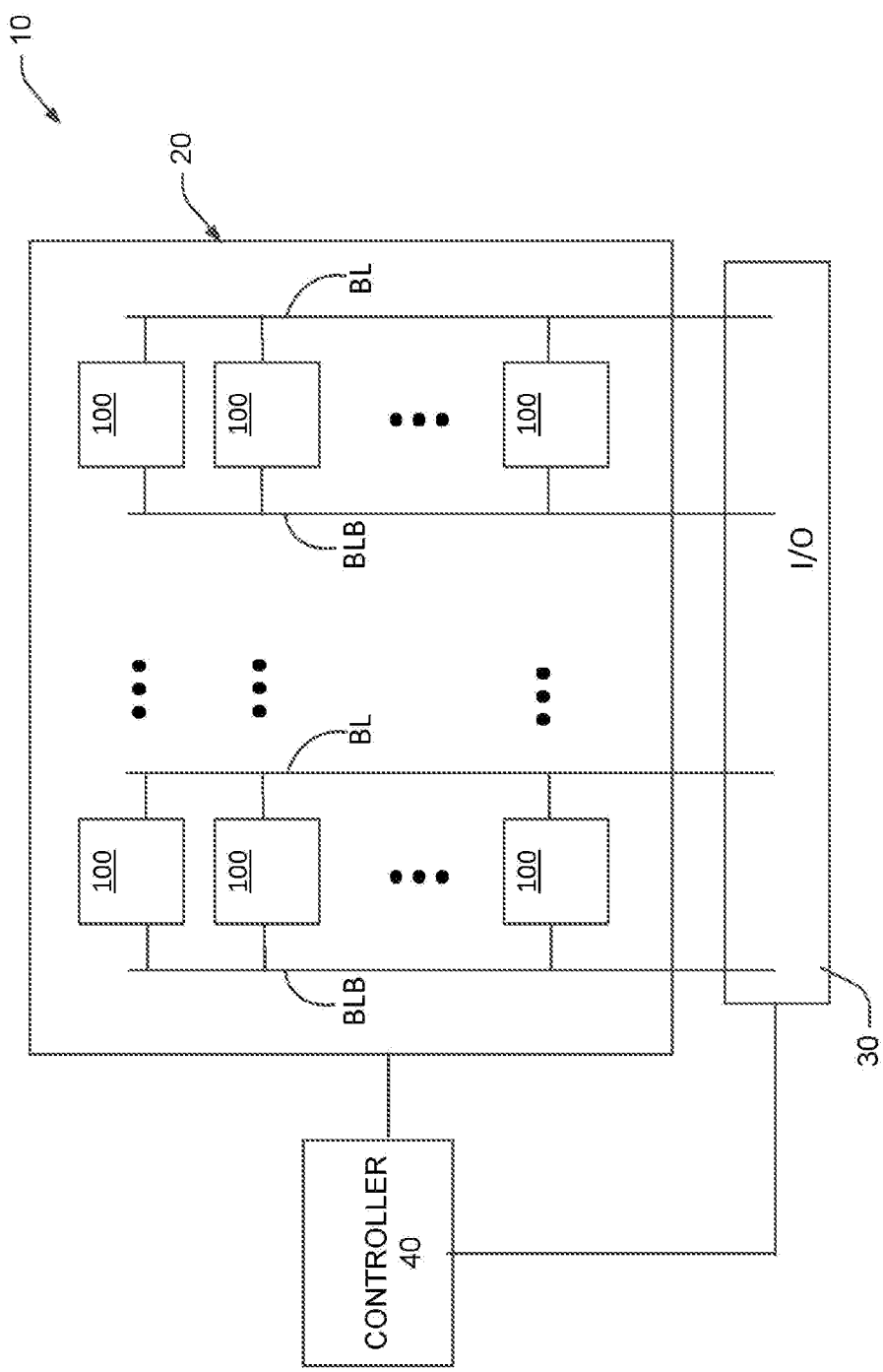
FIG. 1 is a block diagram illustrating an example of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A static random access memory (SRAM) device has an array of memory cells that include transistors connected between an upper reference potential and a lower reference potential such that one of two storage nodes can be occupied by the information to be stored, with the complementary information stored at the other storage node. For example, one typical SRAM memory cell arrangement includes six transistors. Each bit in the SRAM cell is stored on four of the transistors, which form two cross-coupled inverters. The other two transistors are connected to the memory cell word line to control access to the memory cell during read and write operations by selectively connecting the cell to its bit lines.

SRAM is volatile, meaning it requires standby power to maintain its contents. To conserve power, memory devices may include a shut down mode where the memory array is turned off to conserve power. Disclosed embodiments combine non-volatile memory with SRAM memory to achieve the high speed performance of SRAM memory, while maintaining stored data in the event of a power shutdown or power loss.

A nonvolatile memory device is capable of retaining data even after power is cut off. Examples of nonvolatile memory devices include flash memory, ferroelectric random access memories (FRAMs), phase-change random access memories (PRAMs), and magnetic random access memories (MRAMs). MRAMs store data using variations in the magnetization direction at tunnel junctions. The two states of an MRAM cell can be sensed from their relatively higher or lower resistances (RH and RL), which represent different binary logic values of a bit stored in the memory. For example, RL (or high cell current) may be designated as a logical "0" ("Data-0"); RH (or low cell current) may be designated as a logical "1" ("Data-1"). A bit of data, a logic "0" or "1" value, stored in a MRAM memory cell can be determined by comparing a current that flows through the memory cell to a reference current.

Certain types of memory devices, such as MRAM, have two or more resistance states depending on the state of magnetization alignment between two or more layers of magnetic materials, such as ferromagnetic materials. The resistance of a memory cell can be compared to a reference to determine the resistance state of the memory cell. As the density of memory cells increases, the requirement for proper setting of the reference relative to the memory cells becomes more stringent.

More particularly, MRAM stores data at memory cells having two superimposed layers of magnetic material separated by a thin insulating film. The layered structure forms a magnetic tunnel junction ("MTJ" or "MTJ element") of an MRAM cell. The two layers include a magnetic layer that is permanently magnetized in a fixed magnetic field alignment direction (this layer is referred to as a "pinned layer") and a changeably-magnetized magnetic layer (this layer is referred to as a "free layer"). The free layer can be magnetized in one of two orientations relative to the permanently magnetized layer. The two orientations are characterized by distinctly different serial resistances through the superimposed layers of the MTJ. The magnetic field orientation of the changeable layer can be aligned the same as that of the permanent magnet layer (parallel, or "Rp") or opposite to that of the permanent magnet layer (anti-parallel, or "Rap"). The parallel alignment state has a relatively lower resistance and the anti-parallel alignment state has a higher resistance.

In accordance with aspects of disclosed embodiments, a memory device has a plurality of bit cells, each of which has an SRAM cell with a storage node selectively connectable to a bit line to output data stored in the SRAM cell and to receive data to be written to the SRAM cell. Further, each bit cell includes an MRAM cell that is connected to the storage node of the SRAM cell in response to a control signal. Thus, in response to a first event such as a power shut down, the MRAM cell can be connected to the SRAM cell to write data from the volatile SRAM cell to the non-volatile MRAM cell before the SRAM cell loses power. In this manner, data stored in the SRAM cell can be maintained in the MRAM cell when the SRAM cell loses power. After a power up event, the MRAM cell is connected to the SRAM cell, and data from the MRAM cell is written to the SRAM cell. During normal operation of the memory device, the MRAM cells remain disconnected from their corresponding SRAM cells of the memory bit cells, allowing high speed operation of the SRAM memory cells.

FIG. 1 is a block diagram illustrating aspects of a memory device 10 in accordance with disclosed embodiments. The memory device 10 includes a memory array 20 that has a plurality of memory cells or bit cells 100. The bit cells 100 of the memory array 20 are arranged in rows and columns. Each of the rows has a word line, and each of the columns has complementary bit lines BL and BLB corresponding thereto. Each of the bit cells 100 of a given column is connected the corresponding bit lines BL, BLB. The bit lines may be connected to an I/O block 30, which is configured to read and write data to and from the bit lines BL, BLB.

A memory control circuit, or controller 40 is connected to the memory array 20 and the I/O block 30 and is configured to control operations of the memory device 10. The controller receives signals such as clock signals, command signals, address signals, etc. for accessing the bit cells 100 of the memory array 20 and controlling the device 10. For example, address signals may be received and decoded into row and column addresses for accessing the appropriate bit cells 100 of the array for read and write operations.

The controller 40 may further be operative to control and manage power for various components of the memory device 10. For instance, some disclosed examples include multiple power management modes. In a shut down mode, the memory array 20 of the memory device 10, as well as circuits peripheral to the memory array 10 such as the I/O block 30, may be turned off to conserve power. Since SRAM memory is volatile, data stored in the bit cells 100 of the array 20 may be lost in the shut down mode.

Figure 2:
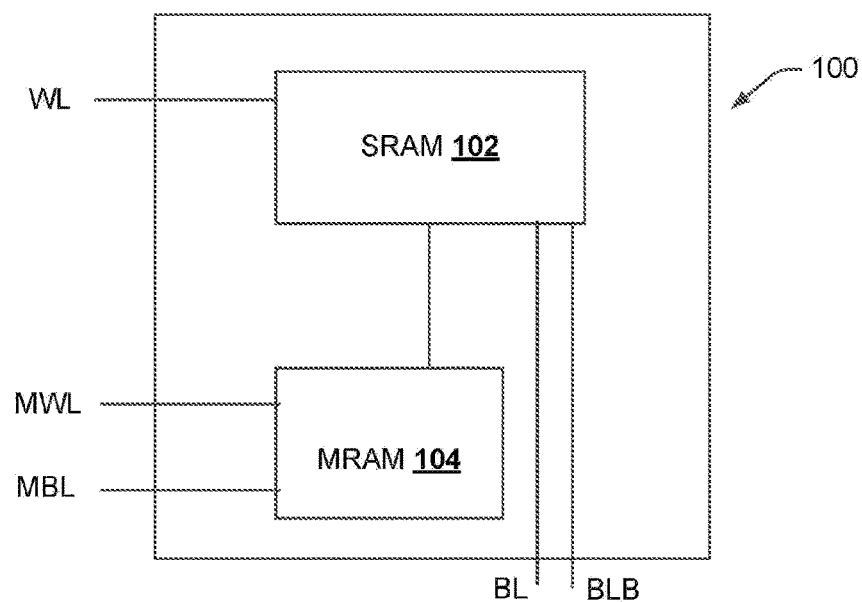
FIG. 2 is a block diagram illustrating an example bit cell in accordance with some embodiments.

FIG. 2 illustrates an example of the bit cells 100 shown in FIG. 1. The bit cell 100 includes an SRAM cell 102 that has a storage node selectively connectable to the complementary bit lines BL and BLB in response to a control signal received on the word line WL. The bit cell 100 further includes an MRAM cell 104 selectively connectable to the storage node of the SRAM cell 102 in response to a control signal received on a second word line, or MRAM word line MWL. The MRAM cell 104 is further connected to a second bit line, or MRAM bit line MBL in the example shown in FIG. 2.

Figure 3:
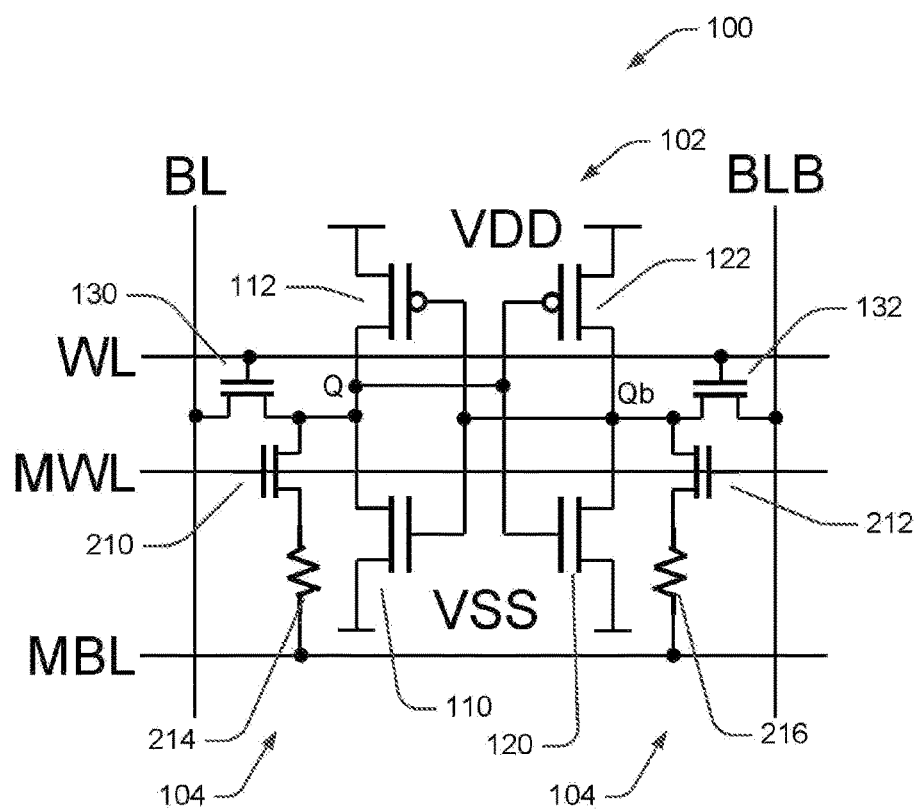
FIG. 3 is a schematic diagram illustrating an example of the bit cell shown in FIG. 2 in accordance with some embodiments.

FIG. 3 is a schematic diagram illustrating further aspects of an example of the bit cell 100. The SRAM cell 102 of the illustrated example bit cell 100 includes but is not limited to a six-transistor (6T) SRAM structure. In some embodiments more or fewer than six transistors may be used to implement the SRAM cell 102. For example, the SRAM cell 102 in some embodiments may use a 4T, 8T or 10T SRAM structure. The SRAM cell 102 includes a first inverter formed by a NMOS/PMOS transistor pair 110 and 112, a second inverter formed by a NMOS/PMOS transistor pair 120 and 122, and SRAM access transistors/SRAM access 130 and 132. Transistors 110, 120, 130 and 132 include n-type metal-oxide-semiconductor (NMOS) transistors, and transistors 122 and 132 include p-type metal-oxide semiconductor (PMOS) transistors.

The first and second inverters are cross coupled to each other to form a latching circuit for data storage of the SRAM cell 102. A first terminal of each of transistors 112 and 122 is coupled to a power supply terminal VDD, while a first terminal of each of transistors 110 and 120 is coupled to a reference voltage terminal VSS, for example, ground.

A gate of the SRAM access transistor 130 is coupled to a first word line WL. A first source/drain terminal of the SRAM access transistor 130 is coupled to a first bit line BL. Moreover, a second source/drain terminal of the SRAM access transistor 130 is coupled to a junction of transistors 110 and 112 and also to gates of transistors 120 and 122 at a storage node Q.

Similarly, a gate of the SRAM access transistor 132 is coupled to the word line WL. A first source/drain terminal of the SRAM access transistor 132 is coupled to a first complementary bit line BLB. Moreover, a second source/drain terminal of the SRAM access transistor 132 is coupled to the junction of transistors 112 and 122 and also to gates of transistors 110 and 112 at a complementary storage node Qb.

In general, when the SRAM cell 102 stores a data bit, the first node Q of the SRAM cell 102 is configured to be at a first logical state (1 or 0), and the second node Qb of the SRAM cell 102 is configured to be at a second logical state (0 or 1), wherein the first and second logical states are complementary with each other. A row select control signal received on the first word line WL turns on the SRAM access transistors 130, 132 to connect the nodes Q and Qb to the bit lines BL and BLB so that data can be written to or read from the nodes Q and Qb via the bit lines BL and BLB.

The IO circuit 30 shown in FIG. 1 is operative, for example, to sense the signals on the bit lines BL and BLB compare the received signals of the bit line pair. In example embodiments, when the potential of a one bit line is higher than the potential of the complementary bit line of the bit line pair, the IO circuit 30 reads the output to be logic 1. When the potential of the first bit line is less than the potential of the other bit line of the bit line pair, local IO circuit 130 reads the output to be logic 0.

The bit cell 100 further includes first and second MRAM cells 214 and 216 connected between the MRAM bit line MWL and the respective storage nodes Q and Qb of the SRAM cell 102. In the illustrated example, the MRAM cells 214, 216 include MTJ elements. MRAM access transistors 210 and 212 are connected to the respective MRAM cells 214 and 216, and have gate terminals connected to the MRAM word line MWL. More particularly, in the example shown in FIG. 3, the MRAM access transistors 210 and 212 are connected between the respective storage nodes Q and Qb and MRAM cells 214 and 216. The MRAM word line and bit line MWL and MBL may be global control lines, wherein the MRAM word line and bit line MWL and MBL are connected to all of the memory cells 100 of the array 20. In other embodiments, the MRAM word line and bit line MWL and MBL may be connected to predetermined groups of memory cells 100, or to certain rows or columns of the array 20.

Figure 4:
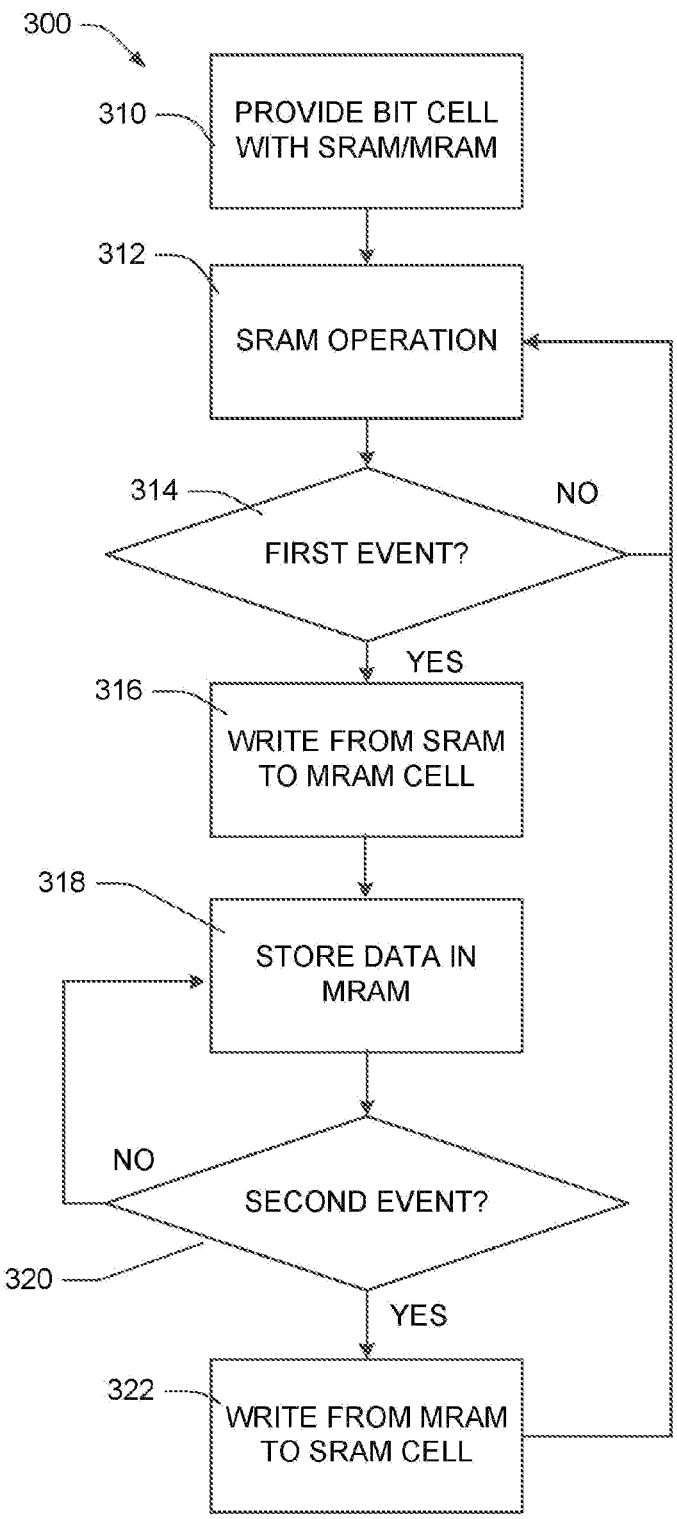
FIG. 4 is a flow diagram illustrating a method in accordance with some embodiments.

FIG. 4 illustrates a method for operating the memory device 10. In general, the method 300 includes a step 310 where a memory bit cell is provided, such as the bit cell 100 described above, which includes the SRAM cell 102 and the MRAM cell 104. During normal operation in step 312, the MRAM word line and bit line MWL and MBL are both held at a logic low (0), thus disconnecting the MRAM cells 104 from the corresponding SRAM cells 102. As such, the memory cells 100 function as SRAM cells. In response to a first event as determined at step 314, such as a power down signal of the memory device 10, data from the SRAM cell 102 are written to the MRAM cell 104 in step 316. In this manner, data are transferred from the volatile SRAM cell 102 to the non-volatile MRAM cell 104 before power to the SRAM cell 102 is lost. This allows maintaining data stored in the memory array 20 even after a power loss. In step 318, the data are stored in the MRAM cell 103 until the occurrence of a second event as shown in step 320. In response to a second event, such as a power up signal at step 320, data are written from the MRAM cell 104 to the SRAM cell 102 at step 322. Thus, when power is returned to the memory device 10, data stored in the MRAM cells 104 are written back to the SRAM cells 102. The MRAM cells 104 are again disconnected from the SRAM cells 102, and the device 10 returns to normal SRAM operation at step 312.

Figure 5:
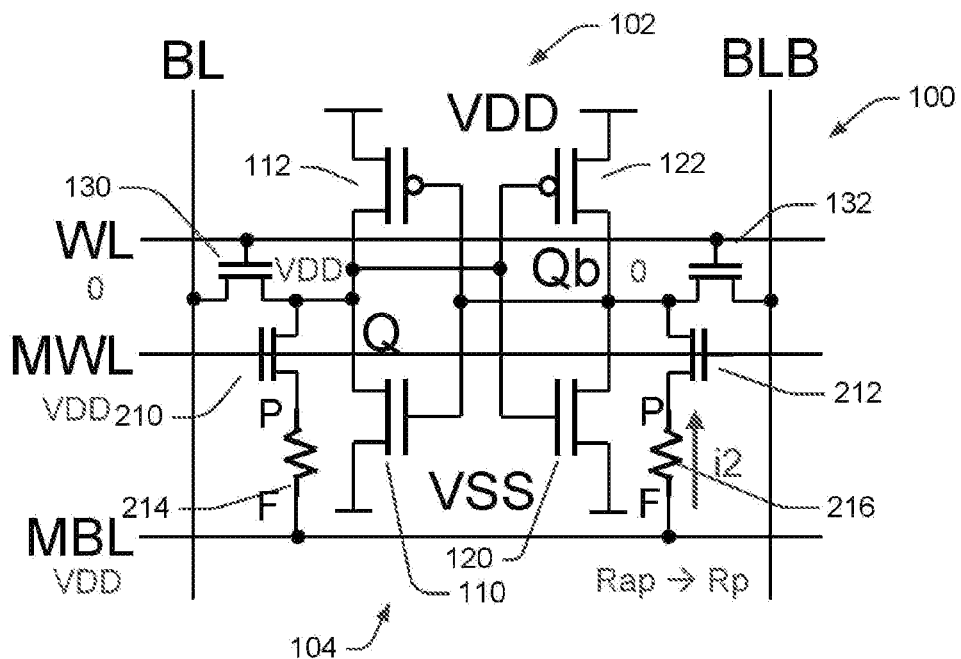
FIGS. 5 and 6 are schematic diagrams illustrating a data transfer operation for the bit cell illustrated in FIG. 3 in accordance with some embodiments.
Figure 6:
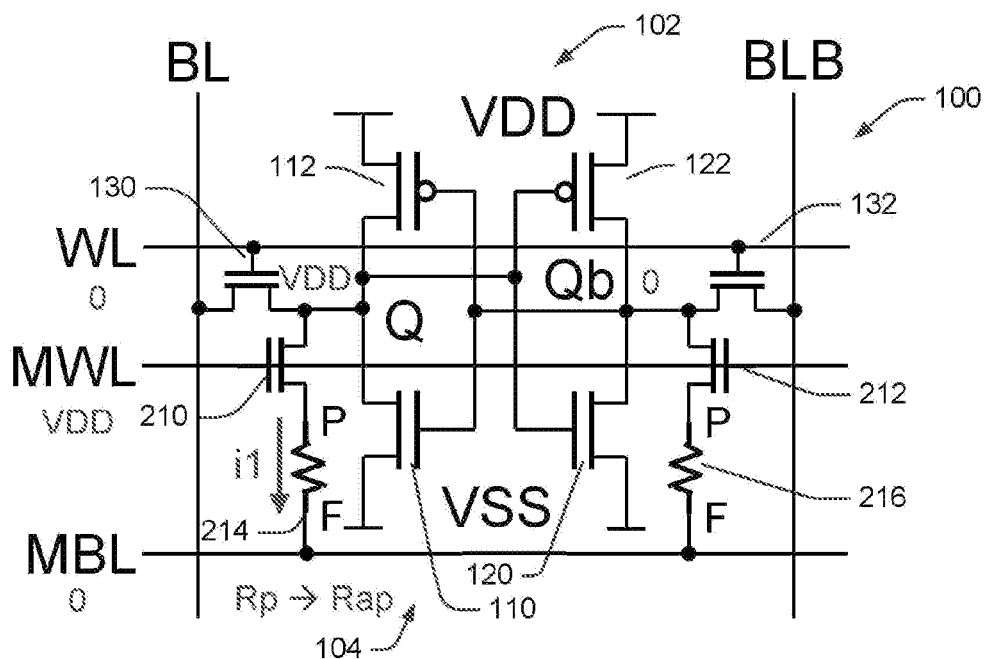
Figure 7:
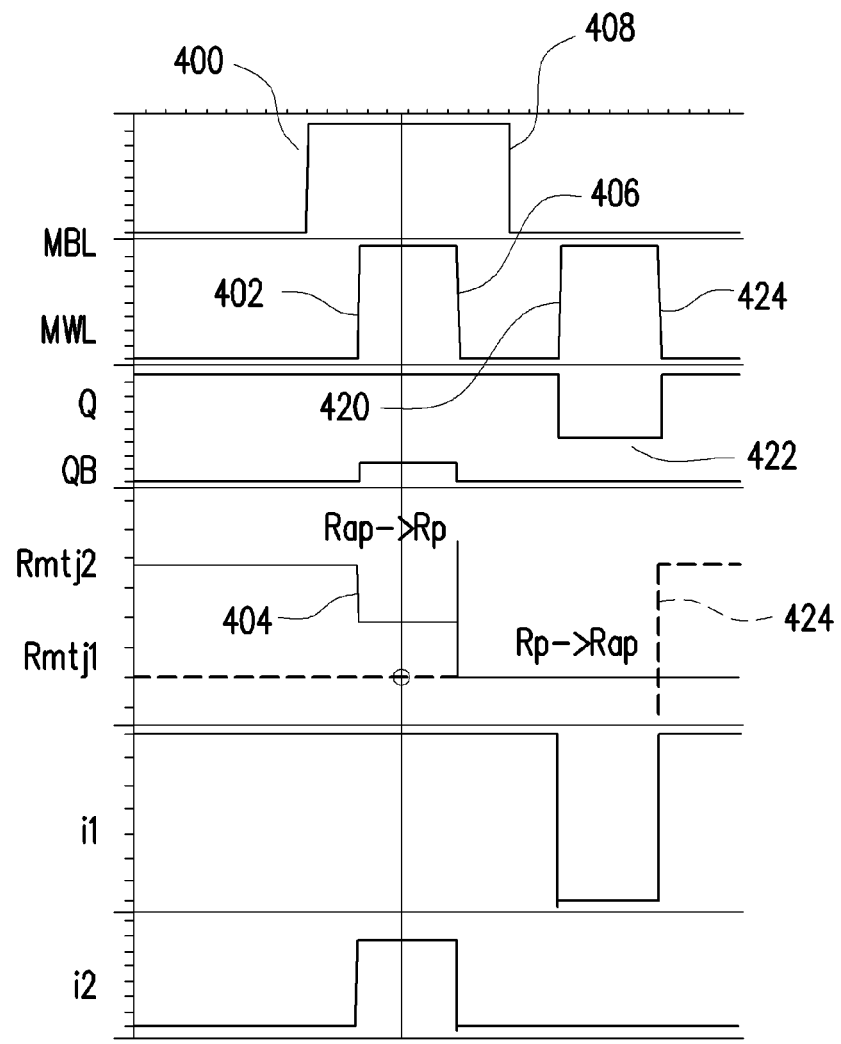
FIG. 7 illustrates wave forms corresponding to the data transfer operation shown in FIGS. 5 and 6 in accordance with some embodiments.

FIGS. 5 and 6 illustrate an example of operating the memory cell 100 for writing data from the SRAM cell 102 to the MRAM cell 102 as indicated in step 316 in response to an event such as power down. FIG. 7 illustrates a series of plots corresponding to the write operation of the MRAM cell 104 shown in FIGS. 5 and 6. FIG. 7 includes plots showing example wave forms for the MRAM bit line MBL, MRAM word line MWL, Q and Qb storage node signals, MRAM cell resistances Rmtj1, Rmtj2, and MRAM cell currents i1 and i2.

As noted above, the Q and Qb storage nodes of the SRAM cell 102 store complementary data. Thus, the MTJ elements 214 and 216 will also store complementary data when the signals from the Q and Qb storage nodes are written to the MRAM cell 104. In other words, one of the MTJ elements will program to Rp (logic low) while the other MTJ element will program to Rap (logic high).

In the illustrated example the SRAM storage nodes Q and Qb are at logic high and low, respectively, and these values are thus written to the respective MTJ elements 214 and 216 of the MRAM cell 104. Initially, the SRAM word line WL goes low (0), turning off the SRAM access transistors 130 and 132 to disconnect the SRAM storage nodes Q and Qb from the bit lines BL and BLB. The MRAM bit line signal MBL is pulsed and thus transitions to logic high (VDD) as indicated at 400 in FIG. 7. Accordingly, the fixed layer F of the MTJ elements 214 and 216 each are connected to the VDD potential on the MRAM bit line MBL. Following the transition 400 of the MRAM bit line MBL to high (VDD), the MRAM word line MWL is pulsed and thus transitions to high (VDD) at 402 in FIG. 7. This turns on the MRAM access transistors 210 and 212, connecting the pinned layer P of the MTJ elements 214 and 216 to the storage nodes Q and Qb, respectively, of the SRAM cell 102. As noted above, in the example of FIGS. 5 and 6 the storage node Q is at logic high (VDD) and the complementary storage node Qb is low (0). As such, the pinned layer P of the MTJ element 216 is at a logic low (0) while its free layer F is at logic high. This difference in potential across the MTJ element 216 causes a current flow i2 shown in FIGS. 5 and 7, resulting in the magnetic field orientation of the MTJ element 216 going to the parallel state Rp as indicated at 404 in FIG. 7. Accordingly, resistance Rmtj2 of the MTJ element 216 lowers while the resistance Rmtj1 of the MTJ element 214 remains constant, and the current level i2 of the MTJ element 214 pulses while the current level i1 of the MTJ element 214 remains constant. The MWL signal then transitions to low at 406, and subsequently the MBL signal transitions to low at 408. As shown in FIG. 7, the pulse width of the MBL signal is wider than the pulse width of the MWL signal. In some examples, the MBL signal pulse width is about twice that of the MWL signal pulse width. For instance, the MBL signal pulse width may be about 100 ns, while the MWL signal pulse width may be about 50 ns.

In this manner, the data at the Qb storage node of the SRAM cell 102 is transferred to the MRAM cell 104. In the illustrated embodiment, the data stored at the Q and Qb storage nodes of the SRAM cell 102 are sequentially transferred from the SRAM cell 102 to the MRAM cell 104. Thus, after transferring the low data bit from the SRAM cell 102 to the MRAM cell 104 (i.e. programming MTJ element 216 to Rp), the high data bit is transferred from the SRAM cell 102 to the MRAM cell 104.

The MRAM bit line MBL is held low, and the MWL signal is again pulsed, transitioning to logic high (VDD) at 420. Accordingly, the fixed layer F of the MTJ elements 214 and 216 each are connected to the logic low signal (0) on the MRAM bit line MBL. The transition 420 of the MWB signal to high turns on the MRAM access transistors 210 and 212, again connecting the pinned layer P of the MTJ elements 214 and 216 to the storage nodes Q and Qb, respectively, of the SRAM cell 102. As such, the pinned layer P and the free layer F of the MTJ element 216 both remain at logic low (0). The free layer F of the MTJ element 214 is also at logic low, while its pinned layer P is connected to the logic high signal (VDD) at the Q storage node. This difference in potential across the MTJ element 214 causes a current flow i1 shown in FIGS. 6 and 7, resulting in the Q signal being pulled low at 422 as the magnetic field orientation of the MTJ element 214 transitions to the anti-parallel Rap state. Accordingly, the resistance Rmtj1 of the MTJ element 214 increases at 424. The high Q signal from the SRAM cell 102 is thus transferred to the MTJ element 214 of the MRAM cell 104.

As noted above, at step 320 in FIG. 4 the occurrence of a second event such as a power up is determined. In response to a power up event, for example, the data stored in the MRAM cell 104 is written to the SRAM cell 102 as shown in step 322. In general, data from the MTJ elements 214 and 216 are read by the SRAM cell 102 by holding the MRAM bit line MBL low, setting the MRAM word line MWL high, and then ramping up the VDD voltage signal from 0 to the logic 1 level, causing the MTJ states to transfer to SRAM storage nodes Q and Qb.

Figure 8:
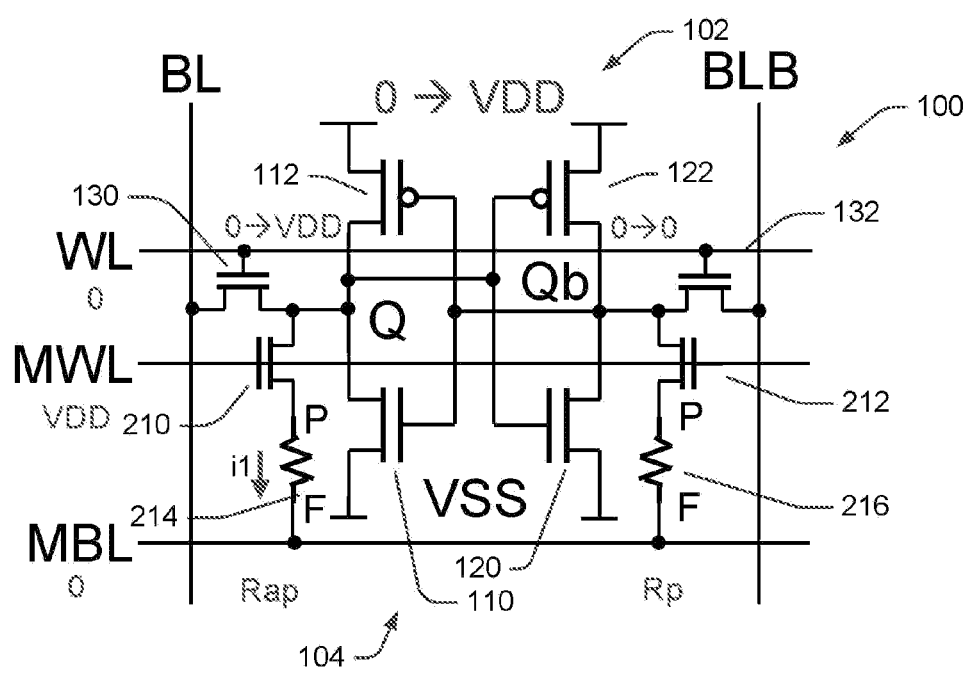
FIG. 8 is schematic diagrams illustrating another data transfer operation for the bit cell illustrated in FIG. 3 in accordance with some embodiments.
Figure 9:
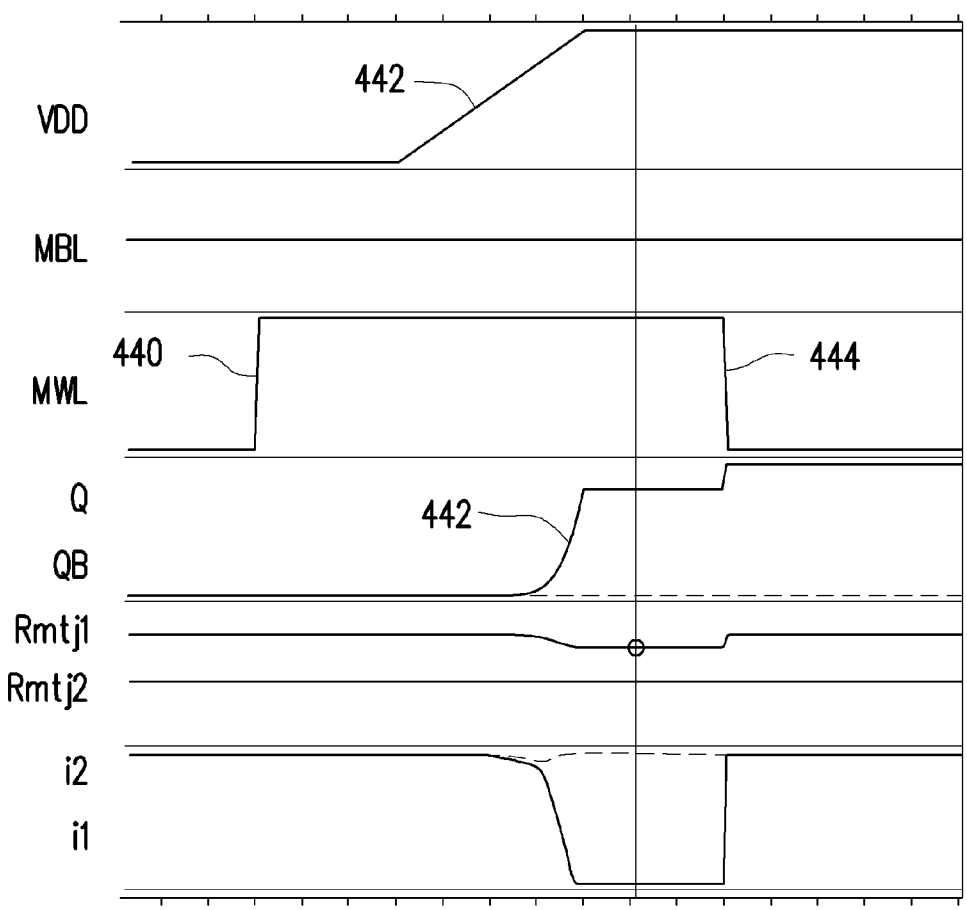
FIG. 9 illustrates wave forms corresponding to the data transfer operation shown in FIG. 8 in accordance with some embodiments.

FIGS. 8 and 9 illustrate an example of the transfer of data from the MRAM cell 104 to the SRAM cell. More particularly, FIG. 8 illustrates the bit cell 100 of FIG. 3, and FIG. 9 illustrates signal waveforms for the VDD voltage, MRAM bit line MBL, MRAM word line MWL, the SRAM storage nodes Q and Qb, resistance levels Rmtj1 and Rmtj2 of the MTJ elements 214 and 216, and the MTJ currents i1 and i2 of the MTJ elements 214 and 216. In the example shown in FIGS. 8 and 9, a high data bit is to be transferred from the MTJ element 214 of the MRAM cell 104 to the Q storage node of the SRAM cell 102, while a logic low is to be transferred from the MTJ element 216 of the MRAM cell 104 to the Qb storage node of the SRAM cell 102.

As shown in FIG. 9, the MBL signal is held low, and the MRAM word line signal is pulsed. Thus, the MWL signal transitions to high at 440. The high MWL signal turns on the MRAM access transistors 210 and 212, connecting the SRAM storage nodes Q and Qb respectively to the pinned layers P of the MTJ elements 214 and 216. As a result of the operation illustrated in FIGS. 5-7, the MTJ elements 214 and 216 are Rap and Rp states, respectively.

The VDD signal is ramped up at 442. In some embodiments, the controller 40 is configured to control the voltage level of the VDD signal. In other examples, a power header circuit is included to ramp up the VDD signal. In the illustrated example, the VDD voltage ramps up from 0 volts to 1 volt over about 40 ns. Since the MTJ element is at the Rap state, the increasing VDD signal pulls the Q storage node high as indicated at 442 in FIG. 9, while the Qb storage node remains at logic low (0). Thereafter at 444 the MWL signal transitions to low, turning off the MRAM access transistors 210 and 212 and disconnecting the MTJ elements 214 and 216 from the respective SRAM storage nodes Q and Qb.

Figure 10:
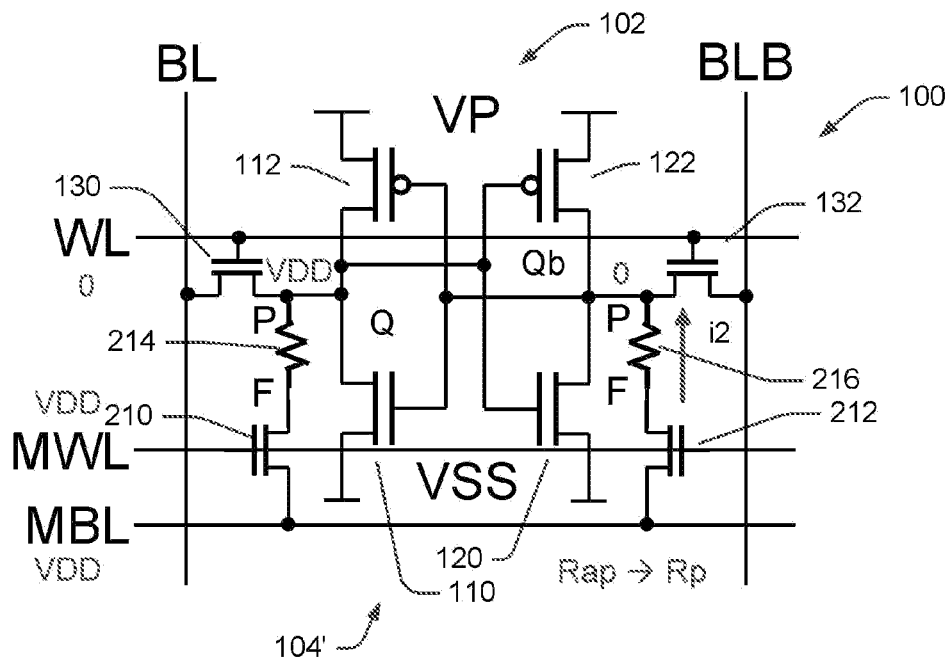
FIGS. 10 and 11 are schematic diagrams illustrating another example of the bit cell shown in FIG. 2, along with a data transfer operation for the illustrated bit cell in accordance with some embodiments.
Figure 11:
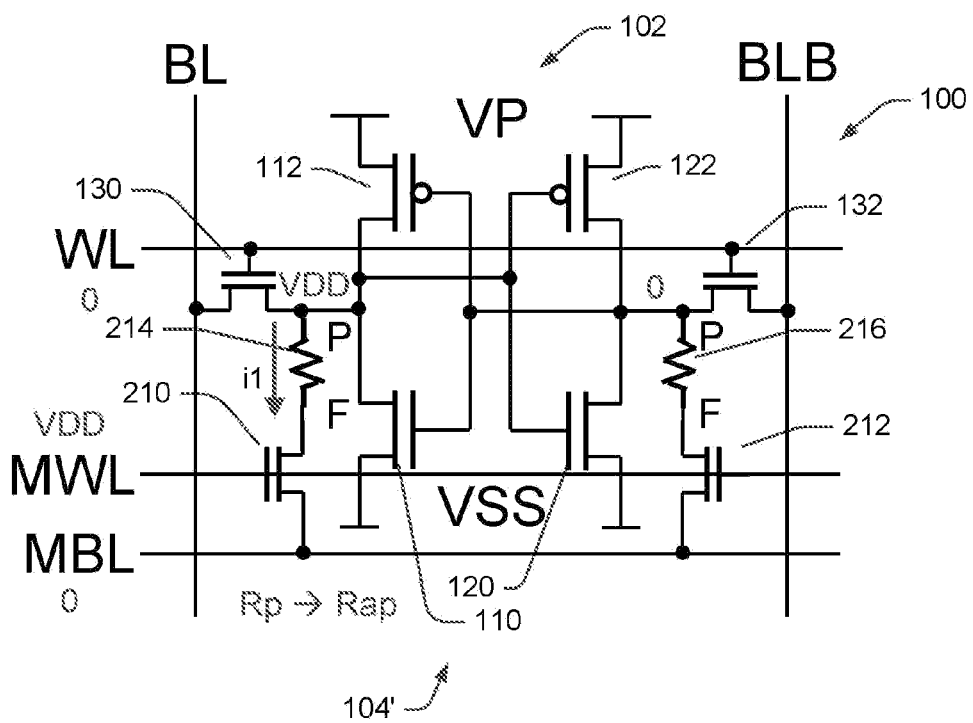

FIGS. 10 and 11 illustrate another example of the bit cell 100 having an alternative embodiment of the MRAM cell 104'. In the MRAM cell 104', the MRAM access transistors 210 and 212 are positioned differently than the embodiment of the MRAM cell 104. As shown in FIGS. 10 and 11, the access transistor 210 is connected between the MTJ element 214 and the MRAM bit line MBL, and access transistor 212 is connected between the MTJ element 216 and the MRAM bit line MBL. More particularly, the fixed layers F of the MTJ elements 214 and 216 are connected to the SRAM storage nodes Q and Qb, respectively, and the pinned layers P are connected to the access transistors 210 and 212, respectively. The remaining aspects of the bit cell 100 shown in FIGS. 10 and 11 is similar to the embodiment shown in FIGS. 5 and 6, and as such all details are not described again here.

Figure 12:
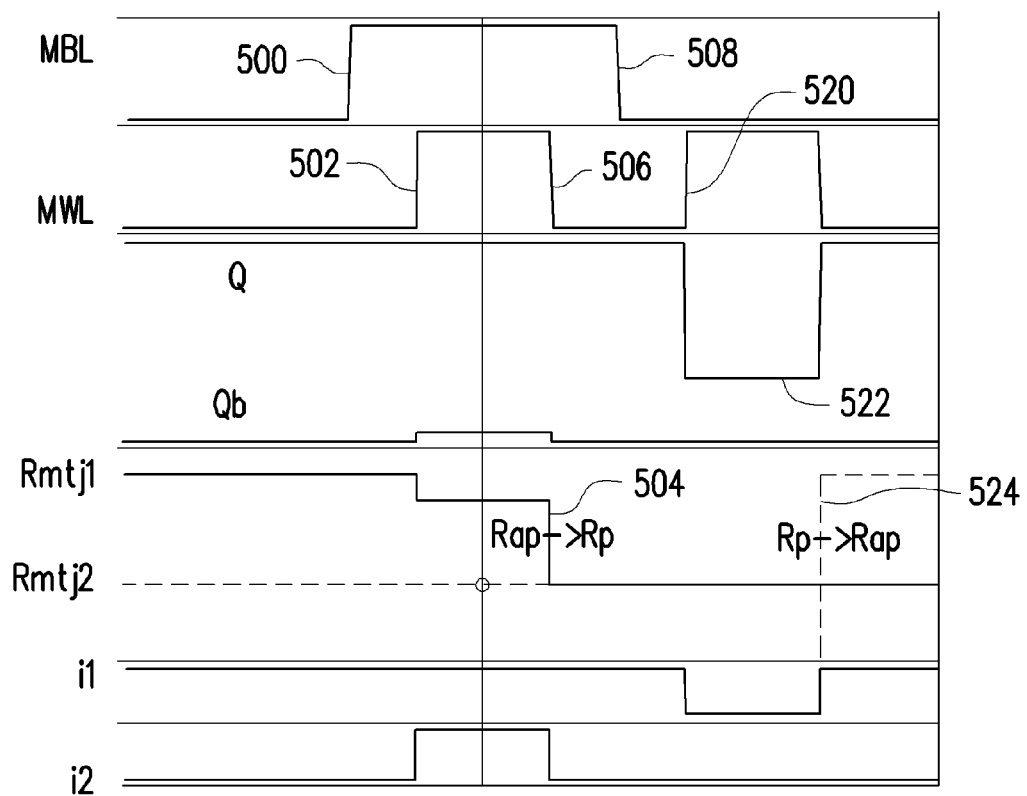
FIG. 12 illustrates wave forms corresponding to the data transfer operation shown in FIGS. 10 and 11 in accordance with some embodiments.

FIG. 12 illustrates plots showing example wave forms for the MRAM bit line MBL, MRAM word line MWL, Q and Qb storage node signals, MRAM cell resistances Rmtj1 and Rmtj2, and MRAM cell currents i1 and i2. In the example shown in FIGS. 10-12, SRAM storage nodes Q and Qb are at logic high and low, respectively, and these values are thus written to the respective MTJ elements 214 and 216 of the MRAM cell 104'. Initially, the SRAM word line WL goes low (0), turning off the SRAM access transistors 130 and 132 to disconnect the SRAM storage nodes Q and Qb from the bit lines BL and BLB. The MRAM bit line signal MBL is pulsed and thus transitions to logic high (VDD) at 500 in FIG. 12. Following the transition 500 of the MRAM bit line MBL to high (VDD), the MRAM word line MWL is pulsed and thus transitions to high (VDD) at 502. This turns on the MRAM access transistors 210 and 212, connecting the free layers F of the MTJ elements 214 and 216 to the VDD potential on the MRAM bit line MBL resulting in the negative current flow i2. This transitions the MTJ element 216 to the Rp state as indicated at 504 as the MWL signal transitions to low at 506. The low data on the SRAM storage node Qb is thus transferred to the MTJ element 216.

The MWL signal transitions to low at 506, and subsequently the MBL signal transitions to low at 508. Similarly to the MBL and MWL wave forms shown in FIG. 7, the pulse width of the MBL signal shown in FIG. 12 is wider than the pulse width of the MWL signal. In some examples, the MBL signal pulse width is about 100 ns, while the MWL signal pulse width is about 50 ns.

After transferring the low data bit from the SRAM cell 102 to the MRAM cell 104' (i.e. programming MTJ element 216 to Rp), the high data bit is transferred from the storage node Q of the SRAM cell 102 to the MRAM cell 104'. The MRAM bit line MBL is held low, and the MWL signal is again pulsed, transitioning to logic high (VDD) at 520. This connects the free layer F of the MTJ elements 214 and 216 to the logic low signal (0) on the MRAM bit line MBL. The transition 520 of the MWL signal to high turns on the MRAM access transistors 210 and 212, connecting the free layer F of the MTJ elements 214 and 216 to the low MRAM bit line MBL. The pinned layer P of the MTJ element 214 is connected to the Q storage node at logic high, causing a current flow i1 shown in FIGS. 11 and 12, resulting in the Q signal being pulled low at 522 as the magnetic field orientation of the MTJ element 214 transitions to the Rap state. Accordingly, the resistance Rmtj1 of the MTJ element 214 increases at 524. The high Q signal from the SRAM cell 102 is thus transferred to the MTJ element 214 of the MRAM cell 104.

Figure 13:
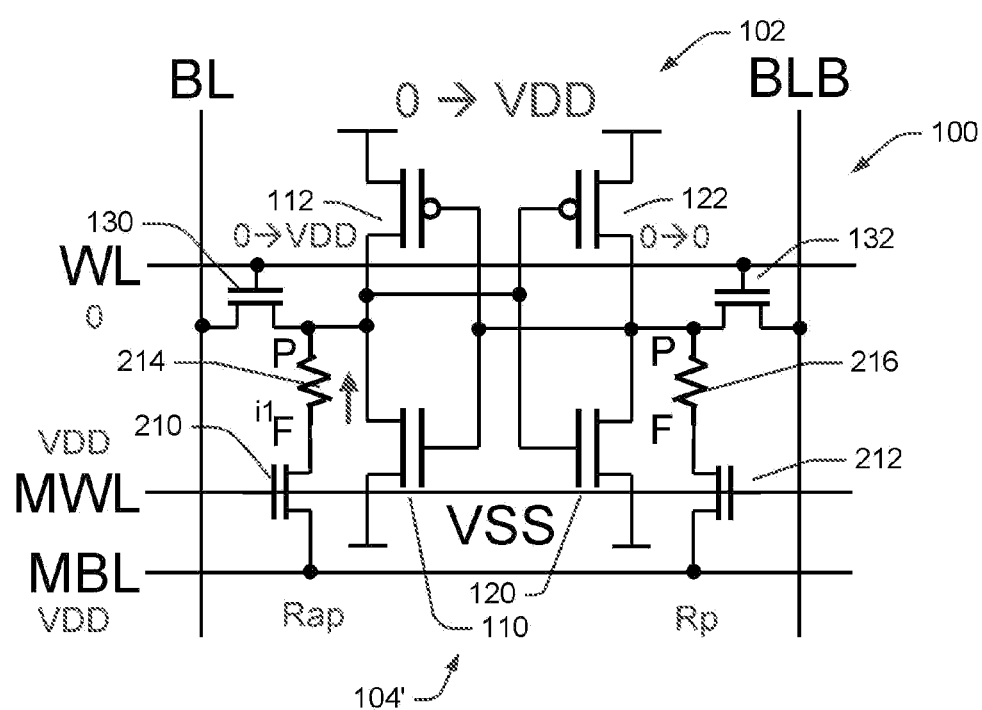
FIG. 13 is schematic diagrams illustrating another data transfer operation for the bit cell illustrated in FIGS. 10 and 11 in accordance with some embodiments.
Figure 14:
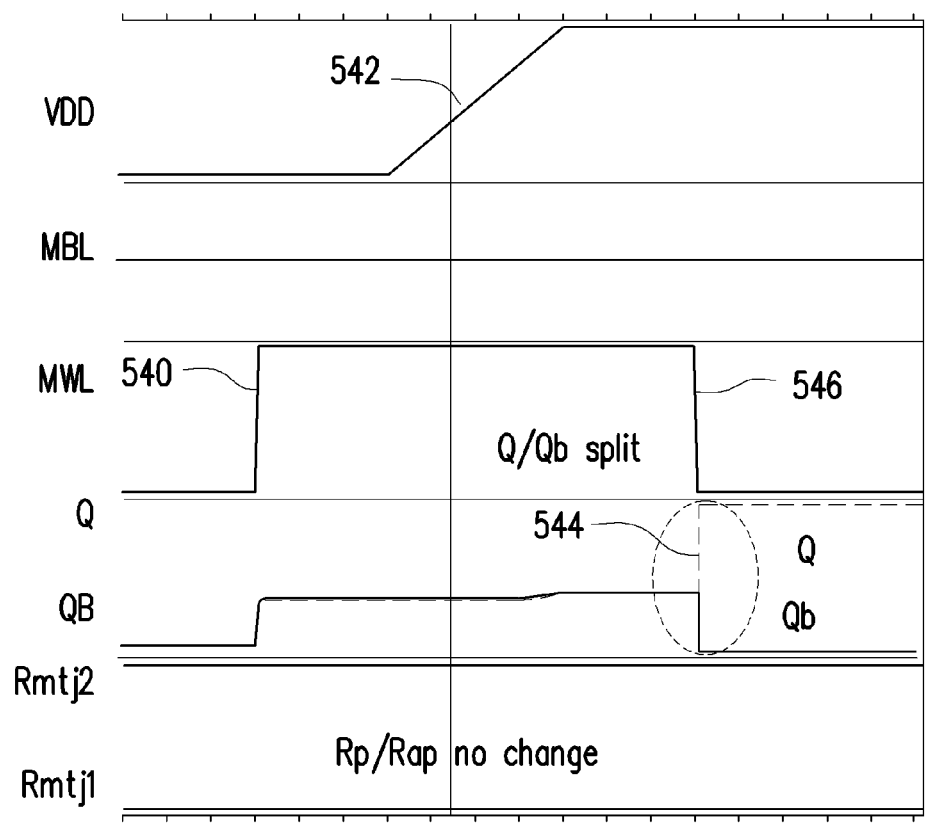
FIG. 14 illustrates wave forms corresponding to the data transfer operation shown in FIG. 13 in accordance with some embodiments.

FIGS. 13 and 14 illustrate an example of the transfer of data from the MRAM cell 104' to the SRAM cell 102 for the embodiment shown in FIGS. 10-12. FIG. 14 illustrates signal waveforms for the VDD voltage, MRAM bit line MBL, MRAM word line MWL, the SRAM storage nodes Q and Qb, and resistance levels Rmtj1 and Rmtj2 of the MTJ elements 214 and 216. In the example shown in FIGS. 13 and 14, a high data bit is to be transferred from the MTJ element 214 of the MRAM cell 104' to the Q storage node of the SRAM cell 102, while a logic low is to be transferred from the MTJ element 216 of the MRAM cell 104' to the Qb storage node of the SRAM cell 102.

As shown in FIG. 14, the MBL is high, and the MRAM word line signal is pulsed. Thus, the MWL signal transitions to high at 540. The high MWL signal turns on the MRAM access transistors 210 and 212, connecting the free layers F of the MTJ elements 214 and 216 to the high signal on the MRAM bit line MBL.

The VDD signal is ramped up at 542. In the illustrated example, the VDD voltage ramps up from 0 volts to 1 volt over about 40-50 ns. Since the MTJ element 214 is at the Rap state, the increasing VDD signal pulls the Q storage node high as indicated at 544 in FIG. 14, while the Qb storage node remains at logic low (0). Thereafter at 546 the MWL signal transitions to low, turning off the MRAM access transistors 210 and 212 and disconnecting the MTJ elements 214 and 216 from the respective SRAM storage nodes Q and Qb.

Figure 15:
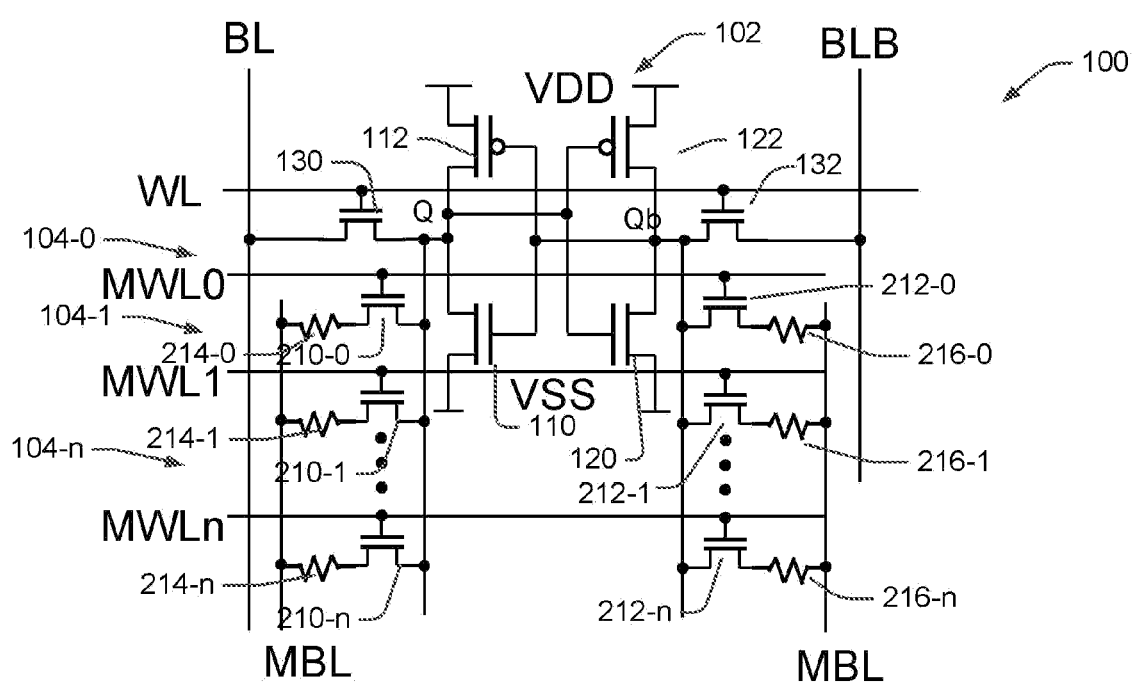
FIG. 15 is a schematic diagram illustrating a further example of the bit cell shown in FIG. 2 in accordance with some embodiments.

FIG. 15 is a schematic diagram illustrating another example bit cell 101 in accordance with disclosed embodiments. The SRAM cell 102 of the example shown in FIG. 15 is similar to the previously disclosed SRAM bit cell and thus is not discussed in detail.

In FIG. 15, the bit cell 101 further includes a plurality of the MRAM bit cells 104-0, 104-1 . . . 104-n (collectively MRAM bit cells 104), each of which are coupled to the SRAM cell 102 to selectively exchange data therewith. More specifically, each of the MRAM bit cells 104 includes first MTJ elements 214-0, 214-1 . . . 214-n (collectively MTJ elements 214), and second MTJ elements 216-0, 216-1 . . . 216-n (collectively MTJ elements 216). The MTJ elements 214 and 216 are connected between the SRAM storage nodes Q and Qb and respective MRAM word lines MWL0, MWL1 . . . MWLn (collectively MRAM word lines MWL).

Each of the MRAM cells 104 further includes first MRAM access transistors 210-0, 210-1 . . . 210n (collectively first MRAM access transistors 210) connected to the respective MTJ elements 214, and second MRAM access transistors 212-0, 212-1 . . . 212-n (collectively second MRAM access transistors 212) connected to the respective MTJ elements 216. In the illustrated embodiment, the first and second MRAM access transistors 210 and 212 are connected between their respective first and second MTJ elements 214 and 216 and the SRAM storage nodes Q and Qb. In other examples, the MRAM access transistors 210 and 212 may be connected between their respective first and second MTJ elements 214 and 216 and the MRAM bit line MBL in the manner shown in FIG. 10. The first and second MRAM access transistors 210 and 212 each have their gate terminal connected to the MRAM word line MWL. In the embodiment shown in FIG. 15, the data stored at the SRAM storage nodes Q and Qb may thus be transferred to several MTJ elements, improving reliability of the data transfer operation. In other examples, predetermined events may transfer SRAM data to preselected ones of the MRAM cells 104. For instance, in response to a first shut down event, data may be transferred from the SRAM cell 102 to the first MRAM cell 104-0. In in response to a second shut down event, data may be transferred from the SRAM cell 102 to the second MRAM cell 104-1, and so on. In this manner, different versions of the SRAM data may be saved in the MRAM cells.

As with the examples disclosed earlier, for normal SRAM operation of the bit cell 101, the MRAM word line MWL and bit line MBL are set low to disconnect the MRAM cells 104 from the SRAM cell 102. For transferring data between the SRAM cell 102 and the MRAM cells 104, the SRAM word line WL is held low such that the SRAM bit lines BL and BLB are not connected to the storage nodes Q and Qb. To write to a specific one of the MRAM cells 104, the corresponding MRAM word line is selected (i.e. set to logic high in the illustrated example) to turn on the corresponding access transistors 210 and 212. The MRAM bit line MBL may be a global control, set to 0 for writing to the corresponding MRAM cell or set to 1 for reading from the MRAM cell as described in the examples above.

Disclosed embodiments thus provide bit cells that each have an SRAM cell and an MRAM cell, so that the bit cells have the speed advantage of SRAM memory and the non-volatile characteristics of MRAM memory. In response to an event such as a power shut down, the MRAM cell can be connected to the SRAM cell to write data from the volatile SRAM cell to the non-volatile MRAM cell before the SRAM cell loses power. In this manner, data stored in the SRAM cell can be maintained in the MRAM cell when the SRAM cell loses power. After a power up event, the MRAM cell is connected to the SRAM cell, and data from the MRAM cell is written to the SRAM cell. During normal operation of the memory device, the MRAM cells remain disconnected from their corresponding SRAM cells of the memory bit cells, allowing high speed operation of the SRAM memory cells.

Certain disclosed embodiments include a memory device with a plurality of bit cells, each of which includes an SRAM cell having a storage node selectively connectable to a first bit line in response to a control signal received on a first word line. Each bit cell further includes an MRAM cell selectively connectable to the storage node of the SRAM cell in response to a control signal received on a second word line.

In accordance with further embodiments, a memory device includes an array of bit cells arranged in rows and columns, where each row has a first word line and a first bit line corresponding thereto. Each of the bit cells includes an SRAM cell with a storage node, a first SRAM access transistor connected between the storage node and the first bit line. The first SRAM access transistor has a gate terminal connected to the first word line. A first MRAM cell is connected between the storage node of the SRAM cell and a second bit line. A first MRAM access transistor is connected to the first MRAM cell and has a gate terminal connected to a second word line.

In accordance with still further disclosed aspects, a method includes providing a memory bit cell including an SRAM cell and a MRAM cell. In response to a first event, data are written from the SRAM cell to the MRAM cell, and in response to a second event, data are written from the MRAM cell to the SRAM bit cell.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
an SRAM cell having a first storage node selectively connectable to a first bit line in response to a control signal received on a first word line, and a second storage node selectively connectable to a first bit line bar in response to the control signal received on the first word line;
an MRAM cell including a first MTJ selectively connectable to the first storage node of the SRAM cell in response to a control signal received on a second word line, and a second MTJ selectively connectable to the second storage node of the SRAM cell in response to the control signal received on the second word line, wherein the first and second MTJs are connected to a second bit line;
wherein the second bit line is configured to receive an MRAM bit line control signal to connect a first terminal of the first MTJ and a first terminal of the second MTJ to a first voltage level, and thereafter the second word line is configured to receive an MRAM word line control signal to connect the first and second MTJs to the first and second storage nodes, respectively; and
wherein the second bit line is configured to receive the MRAM bit line control signal to connect the first terminal of the first MTJ and the first terminal of the second MTJ to a second voltage level, and thereafter the second word line is configured to receive the MRAM word line control signal to connect the first and second MTJs to the first and second storage nodes, respectively.

2. The memory cell of claim 1, further comprising a first access transistor connected between the first storage node and the first bit line, and having a gate terminal connected to the first word line.

3. The memory cell of claim 2, further comprising a second access transistor connected between the second bit line and the first storage node, and having a gate terminal connected to the second word line.

4. The memory cell of claim 3, wherein the second access transistor is connected between the first MTJ and the first storage node.

5. The memory cell of claim 3, wherein the second access transistor is connected between the first MTJ and the second bit line.

6. The memory cell of claim 3, further comprising a third access transistor connected between the second storage node and the first bit line bar, and having a gate terminal connected to the first word line.

7. The memory cell of claim 6, further comprising a fourth access transistor connected between the second bit line and the second storage node QB, and having a gate terminal connected to the second word line.

8. The memory cell of claim 7, wherein the fourth access transistor is connected between the second MTJ and the second storage node.

9. The memory cell of claim 7, wherein the fourth access transistor is connected between the second MTJ and the second bit line.

10. The memory cell of claim 1, wherein each bit cell comprises a plurality of the MRAM cells selectively connectable to the first storage node of the SRAM cell.

11. The memory cell of claim 1, wherein each bit cell comprises a plurality of the MRAM cells selectively connectable to the second storage node of the SRAM cell.

12. The memory cell of claim 1, wherein the first voltage level is a logic high level, and the second voltage level is a logic low level.

13. The memory cell of claim 1, wherein the MRAM cell includes:
a third MTJ connected between the first storage node and the third bit line; and
a fourth MTJ connected between the second storage node and the third bit line.

14. The memory cell of claim 1, wherein the first terminal of the first MTJ and the first terminal of the second MTJ are fixed layers, and wherein the second terminal of the first MTJ and the second terminal of the second MTJ are pinned layers.

15. A method, comprising:
providing a memory bit cell including an SRAM cell and an MRAM cell;
in response to a first event, writing data from a first storage node of the SRAM cell to a first MTJ of the MRAM cell;
in response to the first event and after writing the data from the first storage node of the SRAM cell to the first MTJ of the MRAM cell, writing data from a second storage node of the SRAM cell to a second MTJ element of the MRAM cell;
in response to a second event, writing data from the first MTJ of the MRAM cell to the first storage node of the SRAM cell, and writing data from the second MTJ element of the MRAM cell to the second storage node of the SRAM cell; and
in response to the second event and after writing the data from the first MTJ of the MRAM cell to the first storage node of the SRAM cell and writing the data from the second MTJ element of the MRAM cell to the second storage node of the SRAM cell, electrically disconnecting the MRAM cell from the SRAM cell,
wherein writing the data from the first storage node of the SRAM cell to the first MTJ of the MRAM cell and write data from a second storage node of the SRAM cell to the second MTJ element of the MRAM cell includes:
providing an MRAM bit line connected to the first MTJ and the second MTJ;
transitioning an MRAM bit line control signal on the MRAM bit line to a logic high level to connect a first terminal of the first MTJ and a first terminal of the second MTJ to the logic high level;
providing a first MRAM access transistor connected to the first MTJ, and a second MRAM access transistor connected to second MTJ;
providing an MRAM word line connected to a gate terminal of the first MRAM access transistor and a gate terminal of the second MRAM access transistor;
transitioning an MRAM word line control signal on the MRAM word line to the logic high level to turn on the first and second MRAM access transistors and connect a second terminal of the first MTJ to the first storage node and a second terminal of the second MTJ to the second storage node;
transitioning the MRAM word line control signal to a logic low level; and thereafter
transitioning the MRAM bit line control signal to the logic low level;

transitioning the MRAM word line control signal to the logic high level while holding the MRAM bit line control signal at the logic low level; and transitioning the MRAM word line control signal to the logic low level while holding the MRAM bit line control signal at the logic low level.

16. The method of claim 15, wherein the first event is a power down and wherein the second event is a power up.

17. A method, comprising:
providing an SRAM cell having a first storage node selectively connectable to a first bit line in response to a control signal received on a first word line, and a second storage node selectively connectable to a first bit line bar in response to the control signal received on the first word line;

providing an MRAM cell including a first MTJ selectively connectable to the first storage node of the SRAM cell in response to a control signal received on a second word line, and a second MTJ selectively connectable to the second storage node of the SRAM cell in response to the control signal received on the second word line, wherein the first and second MTJs are connected to a second bit line MBL;

connecting a free layer terminal of the first MTJ to a first voltage level in response to an MRAM bit line control signal received on the second bit line;

connecting a free layer terminal of the second MTJ to the first voltage level in response to the MRAM bit line control signal received on the second bit line;

after connecting the free layer terminal of the first MTI to the first voltage level, connecting a pinned layer terminal of the first MTJ to the first storage node of the SRAM cell in response to an MRAM word line control signal received on the second word line;

after connecting the free layer terminal of the second MTI to the first voltage level connecting a pinned layer terminal of the second MTJ to the second storage node of the SRAM cell in response to the MRAM word line control signal received on the second word line;

connecting the free layer terminal of the first MTJ to a second voltage level in response to the MRAM bit line control signal received on the second bit line;

connecting the free layer terminal of the second MTJ to the second voltage level in response to the MRAM bit line control signal received on the second bit line;

after connecting the free layer terminal of the first MTJ to the second voltage level, connecting the pinned layer terminal of the first MTJ to the first storage node of the SRAM cell in response to the MRAM word line control signal received on the second word line; and after connecting the free layer terminal of the second MTJ to the second voltage level, connecting the pinned layer terminal of the second MTJ to the second storage node of the SRAM cell in response to the MRAM word line control signal received on the second word line.

18. The method of claim 17, wherein the first voltage level is a logic high level, and the second voltage level is a logic low level.

19. The method of claim 17, further comprising:
connecting the first storage node of the SRAM cell to the first bit line in response to the control signal received on the first word line; and connecting the second storage node of the SRAM cell to the first bit line bar in response to the control signal received on the first word line.

20. The method of claim 17, wherein the MRAM bit line control signal is received by a gate terminal of an access transistor connected to the second bit line.

* * * * *